(12) United States Patent
Kurihara et al.

(10) Patent No.: US 8,354,206 B2
(45) Date of Patent: Jan. 15, 2013

(54) METHOD OF GENERATING PHOTOMASK DATA, METHOD OF FABRICATING PHOTOMASK, NON-TRANSITORY MEMORY MEDIUM STORING PROGRAM FOR GENERATING PHOTOMASK DATA, METHOD OF MANUFACTURING SOLID-STATE IMAGE SENSOR HAVING MICROLENS ARRAY AND METHOD OF MANUFACTURING MICROLENS ARRAY

(75) Inventors: Masaki Kurihara, Koza-gun (JP); Kyouhei Watanabe, Yokohama (JP); Shingo Kitamura, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 223 days.

(21) Appl. No.: 12/980,460

(22) Filed: Dec. 29, 2010

(65) Prior Publication Data
US 2011/0165503 A1 Jul. 7, 2011

(30) Foreign Application Priority Data

Jan. 7, 2010 (JP) ................................. 2010-002375
Dec. 17, 2010 (JP) ................................. 2010-282401

(51) Int. Cl.
*G03F 1/36* (2012.01)
*G03F 1/70* (2012.01)
*G03F 7/20* (2006.01)
*G03F 7/26* (2006.01)
*G06F 17/50* (2006.01)

(52) U.S. Cl. .................... 430/5; 430/7; 430/319; 716/55
(58) Field of Classification Search .................. 716/55; 430/5, 7, 319–321
See application file for complete search history.

(56) References Cited

U.S. PATENT DOCUMENTS

2012/0100662 A1* 4/2012 Watanabe ...................... 438/70

FOREIGN PATENT DOCUMENTS

| JP | 2004-145319 A | 5/2004 |
| JP | 2007-193243 A | 8/2007 |
| JP | 2009-031400 A | 2/2009 |
| JP | 2009-31400 A | 2/2009 |

* cited by examiner

*Primary Examiner* — Mark F Huff
*Assistant Examiner* — John S Ruggles
(74) *Attorney, Agent, or Firm* — Fitzpatrick, Cella, Harper & Scinto

(57) ABSTRACT

A method of generating photomask data for fabricating a microlens array, the photomask having a microlens pattern including light-shielding portions and non-light-shielding portions, a rectangular region including a surrounding region having four sides of the rectangular region as outer edges and a primary region having boundaries that are inner edges of the surrounding region, the surrounding region being configured by four strip regions each including one of the four sides as its part, and a width between each outer edge and each corresponding inner edge being not more than 1/2 of a wavelength of exposure light. The method includes determining a layout of light-shielding portions and non-light-shielding portions in the surrounding region so that a density of light-shielding portions is set to fall within a range from 0% to 15%.

10 Claims, 14 Drawing Sheets

| | | \multicolumn{6}{c}{X COORDINATE} |
|---|---|---|---|---|---|---|---|
| | | −1.35 | −1.29 | −1.23 | −1.17 | −1.11 | −1.05 |
| Y COORDINATE | 1.35 | 0.997 | 0.973 | 0.95 | 0.928 | 0.906 | 0.885 |
| | 1.29 | 0.973 | 0.949 | 0.926 | 0.903 | 0.881 | 0.859 |
| | 1.23 | 0.95 | 0.926 | 0.902 | 0.878 | 0.856 | 0.834 |
| | 1.17 | 0.928 | 0.903 | 0.878 | 0.855 | 0.831 | 0.809 |
| | 1.11 | 0.906 | 0.881 | 0.856 | 0.831 | 0.808 | 0.785 |
| | 1.05 | 0.885 | 0.859 | 0.834 | 0.809 | 0.785 | 0.761 |

FIG. 9A

5×5 CELLS ARE TAKEN AS EXAMPLE.
NUMERAL IN TABLE INDICATES TRANSMITTANCE OF LIGHT.
BINARIZATION IS EXECUTED TO HAVE 0.5 AS INTERMEDIATE VALUE OF TRANSMITTANCES AS THRESHOLD.
TRANSMITTANCE > 0.5 → 1.0 (APERTURE).
TRANSMITTANCE ≤ 0.5 → 0 (SHIELD LIGHT).
PROCESSING START POINT IS PIXEL (LENS) CENTER.

▨ CELL WHOSE ERROR DIFFUSION PROCESSING IS IN PROGRESS

| 0.4 | 0.4 | 0.4 | 0.4 | 0.4 |
|-----|-----|-----|-----|-----|
| 0.4 | 0.2 | 0.2 | 0.2 | 0.4 |
| 0.4 | 0.2 | 0.1 | 0.2 | 0.4 |
| 0.4 | 0.2 | 0.2 | 0.2 | 0.4 |
| 0.4 | 0.4 | 0.4 | 0.4 | 0.4 |

FIG. 9B

ERROR (EXAMPLE: 0.1 − 0 = +0.1) GENERATED BY BINARIZATION IS DIFFUSED TO NEIGHBORING CELLS AFTER IT IS WEIGHTED.

(EXAMPLE)
(1)+0.1*1/(1+1+1+1+0.5+0.5+0.5+0.5)=0.22
(2)+0.1*0.5/6=0.21
(3)+0.1*1/6=0.22
(4)+0.1*0.5/6=0.21
(5)+0.1*1/6=0.22
(6)+0.1*0.5/6=0.21
(7)+0.1*1/6=0.22
(8)+0.1*0.5/6=0.21

| 0.4 | 0.4 | 0.4 | 0.4 | 0.4 |
|-----|-----|-----|-----|-----|
| 0.4 | 0.2(8) | 0.2(1) (2)0.2 | (3)0.2 | 0.4 |
| 0.4 | 0.2(7) | 0 | (4)0.2 | 0.4 |
| 0.4 | 0.2(6) | 0.2(5) | 0.2 | 0.4 |
| 0.4 | 0.4 | 0.4 | 0.4 | 0.4 |

FIG. 9C

SAME OPERATION IS SEQUENTIALLY PERFORMED BY MOVING TO NEIGHBORING CELL.

▨ CELL WHOSE ERROR DIFFUSION PROCESSING IS IN PROGRESS
▩ CELL WHOSE ERROR DIFFUSION PROCESSING IS COMPLETE

| 0.4 | 0.4 | 0.4 | 0.4 | 0.4 |
|---|---|---|---|---|
| 0.4 | 0.21 | 0.22 | 0.21 | 0.4 |
| 0.4 | 0.22 | ▩ | 0.22 | 0.4 |
| 0.4 | 0.21 | ▨0.22 | 0.21 | 0.4 |
| 0.4 | 0.4 | 0.4 | 0.4 | 0.4 |

FIG. 9D

NO ERROR IS DIFFUSED TO CELL WHOSE BINARIZATION PROCESSING IS COMPLETE.

(EXAMPLE) ERROR 0.22−0=+0.22
(1)+0.22*1/(1+1+0.5+0.5+0.5+0.5+0.5)=0.25
(2)+0.22*0.5/5=0.42
(3)+0.22*1/5=0.44
(4)+0.22*0.5/5=0.42
(5)+0.22*1/5=0.25
(6)+0.22*0.5/5=0.24
(7)+0.22*0.5/5=0.24

| 0.4 | 0.4 | 0.4 | 0.4 | 0.4 |
|---|---|---|---|---|
| 0.4 | 0.21 | 0.22 (7) 0.21 (2) | (3) 0.4 | 0.4 |
| 0.4 | 0.22 | ▩ (1) | (5) 0.4 | 0.4 |
| 0.4 | 0.21 | 0.22 (6) 0.21 | (4) 0.4 | 0.4 |
| 0.4 | 0.4 | 0.4 | 0.4 | 0.4 |

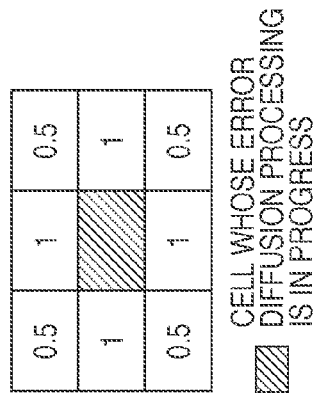
FIG. 9E
SAME OPERATION IS PERFORMED IN ORDER OF CELLS HAVING SHORTER DISTANCES FROM CENTER OF PIXEL.
▨ CELL WHOSE ERROR DIFFUSION PROCESSING IS IN PROGRESS
▩ CELL WHOSE ERROR DIFFUSION PROCESSING IS COMPLETE
FIG. 10
| 0.5 | 1 | 0.5 |
|-----|---|-----|
| 1 | ▨ | 1 |
| 0.5 | 1 | 0.5 |
▨ CELL WHOSE ERROR DIFFUSION PROCESSING IS IN PROGRESS
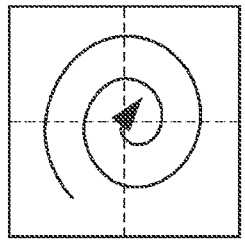
FIG. 11D
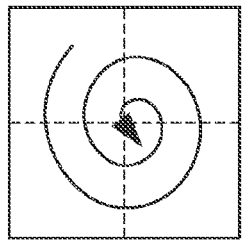
FIG. 11C
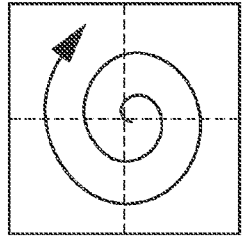
FIG. 11B
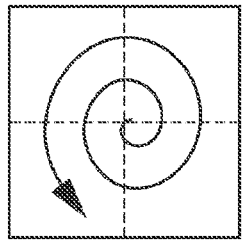
FIG. 11A

METHOD OF GENERATING PHOTOMASK DATA, METHOD OF FABRICATING PHOTOMASK, NON-TRANSITORY MEMORY MEDIUM STORING PROGRAM FOR GENERATING PHOTOMASK DATA, METHOD OF MANUFACTURING SOLID-STATE IMAGE SENSOR HAVING MICROLENS ARRAY AND METHOD OF MANUFACTURING MICROLENS ARRAY

BACKGROUND OF THE INVENTION

1. Field of the Invention

The present invention relates to a method of generating photomask data, a method of fabricating a photomask, a memory medium storing programs for generating photomask data, a method of manufacturing a solid-state image sensor and a method of manufacturing a microlens array.

2. Description of the Related Art

A solid-state image sensor has microlenses that are used to enhance focusing efficiency on light-receiving units (photoelectric converters). Japanese Patent Laid-Open No. 2004-145319 discloses a method of forming microlenses by exposing and developing a photosensitive lens material layer using a photomask which can control amounts of transmitting light by a micro-dot pattern arrangement.

SUMMARY OF THE INVENTION

The present inventors found that a shape of a boundary portion between microlenses did not have a target shape even when a transmitting light amount distribution was determined according to a target microlens shape to fabricate a photomask having the transmitting light amount distribution, and the microlenses were formed using that photomask. FIG. 15 is a view exemplifying a target microlens shape 300, and an actually formed shape 301. In a boundary portion between microlenses ML, a phenomenon that the actual shape 301 of the microlenses ML becomes smoother than the target shape 300 is observed.

The present invention provides a technique effective to prevent a boundary portion between microlenses from being smoothed.

The first aspect of the present invention provides a method of generating photomask data used to fabricate a photomask used to manufacture, by photolithography, a microlens array, the photomask having a microlens pattern including light-shielding portions and non-light-shielding portions for forming a microlens, in each of a plurality of two-dimensionally arranged rectangular regions, each rectangular region including a surrounding region having four sides of the rectangular region as outer edges and a primary region having boundaries that are inner edges of the surrounding region, the surrounding region being configured by four strip regions each of the four strip regions including one of the four sides as a part of a contour of the strip region, and a width between the outer edge and the inner edge of the surrounding region being not more than ½ of a wavelength of exposure light used in the photolithography, the method comprising: a first step of determining a layout of light-shielding portions and non-light-shielding portions in the primary region; and a second step of determining a layout of light-shielding portions and non-light-shielding portions in the surrounding region so that a density of light-shielding portions defined by (an area of light-shielding portions)/((an area of light-shielding portions)+(an area of non-light-shielding portions)) is set to fall within a range from 0% to 15% (both inclusive).

The second aspect of the present invention provides a method of fabricating, by photolithography, a photomask used to manufacture a microlens array, the method comprising: a step of generating photomask data by a generation method as defined in the first aspect of the present invention; and a step of fabricating a photomask according to the photomask data.

The third aspect of the present invention provides a memory medium storing a program for controlling a computer to execute processing for generating photomask data used to fabricate, by photolithography, a photomask that is used to manufacture a microlens array, the photomask having a microlens pattern including light-shielding portions and non-light-shielding portions for forming a microlens, in each of a plurality of two-dimensionally arranged rectangular regions, each rectangular region including a surrounding region having four sides of the rectangular region as outer edges and a primary region having boundaries that are inner edges of the surrounding region, the surrounding region being configured by four strip regions each of the four strip regions including one of the four sides as a part of a contour of the strip region, and a width between the outer edge and the inner edge of the surrounding region being not more than ½ of a wavelength of exposure light used in the photolithography, the program controlling the computer to execute processing including: a first step of determining a layout of light-shielding portions and non-light-shielding portions in the primary region; and a second step of determining a layout of light-shielding portions and non-light-shielding portions in the surrounding region so that a density of light-shielding portions defined by (an area of light-shielding portions)/((an area of light-shielding portions)+(an area of non-light-shielding portions)) is set to fall within a range from 0% to 15% (both inclusive), and the densities of light-shielding portions of the four strip regions are equal to each other.

The fourth aspect of the present invention provides a method of manufacturing a solid-state image sensor, comprising: a step of forming a photoelectric converter array including a plurality of two-dimensionally arranged photoelectric converters; and a step of forming a microlens array on the photoelectric converter array by photolithography using a photomask fabricated by a fabrication method as defined in the second aspect of the present invention.

The fifth aspect of the present invention provides a method of manufacturing a microlens array, comprising: a step of forming a photosensitive material layer on a substrate; and a step of forming a microlens array by exposing and developing the material layer using a photomask fabricated by a fabrication method as defined in the second aspect of the present invention.

Further features of the present invention will become apparent from the following description of exemplary embodiments with reference to the attached drawings.

BRIEF DESCRIPTION OF THE DRAWINGS

FIGS. 9A to 9E are views showing a practical example of binarization based on an error diffusion method;

FIG. 10 shows an example of a matrix for error diffusion in binarization processing based on the error diffusion method;

FIGS. 11A to 11D are views showing the orders of binarization processing based on the error diffusion method;

FIG. 15 is a view for explaining a problem; and.

DESCRIPTION OF THE EMBODIMENTS

Figure 12:
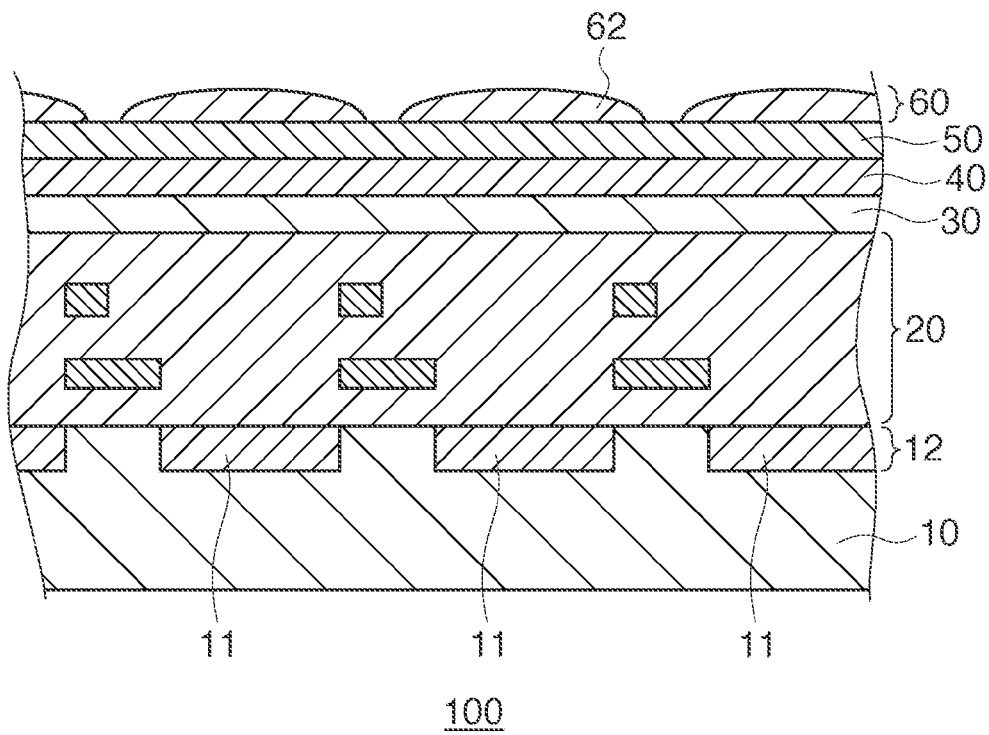
FIG. 12 is a sectional view showing the structure of a solid-state image sensor according to an embodiment of the present invention.

The structure of a solid-state image sensor 100 according to an embodiment of the present invention will be described below with reference to FIG. 12. The solid-state image sensor 100 includes a semiconductor substrate 10 including a photoelectric converter array 12 configured by a plurality of two-dimensionally arranged photoelectric converters 11, and a microlens array 60 on which a plurality of microlenses 62 are arranged. The microlens array 60 is arranged on the photoelectric converter array 12 so that light is focused on each photoelectric converter 11 by the corresponding microlens 62. For example, a multilayer wiring structure 20, first planarizing layer 30, color filter layer 40, and second planarizing layer 50 can be arranged between the semiconductor substrate 10 and microlens array 60 in turn from the semiconductor substrate 10. Note that when the flatness of layers stacked on the semiconductor substrate 10 is sufficient, at least one of the first and second planarizing layers 30 and 50 may be omitted. In a monochrome solid-state image sensor or solid-state image sensors for a multi plane type camera (for example, three solid-state image sensors), the color filter layer 40 may be omitted. The method of manufacturing the solid-state image sensor according to the embodiment of the present invention includes a step of forming the photoelectric converter array 12, and a step of forming the microlens array 60 on the photoelectric converter array 12 by photolithography using a unique photomask to be described below.

Figure 13:
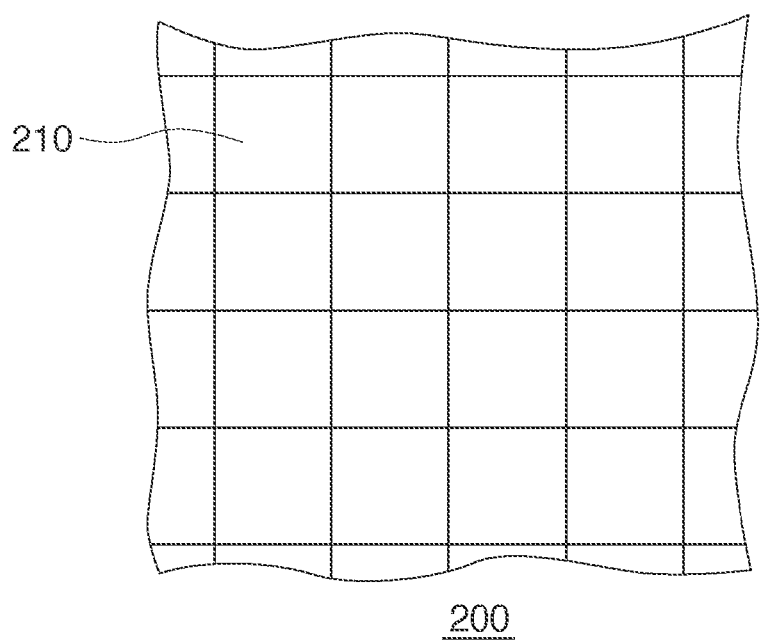
FIG. 13 is a view showing an example of the arrangement of a photomask.
Figure 14:
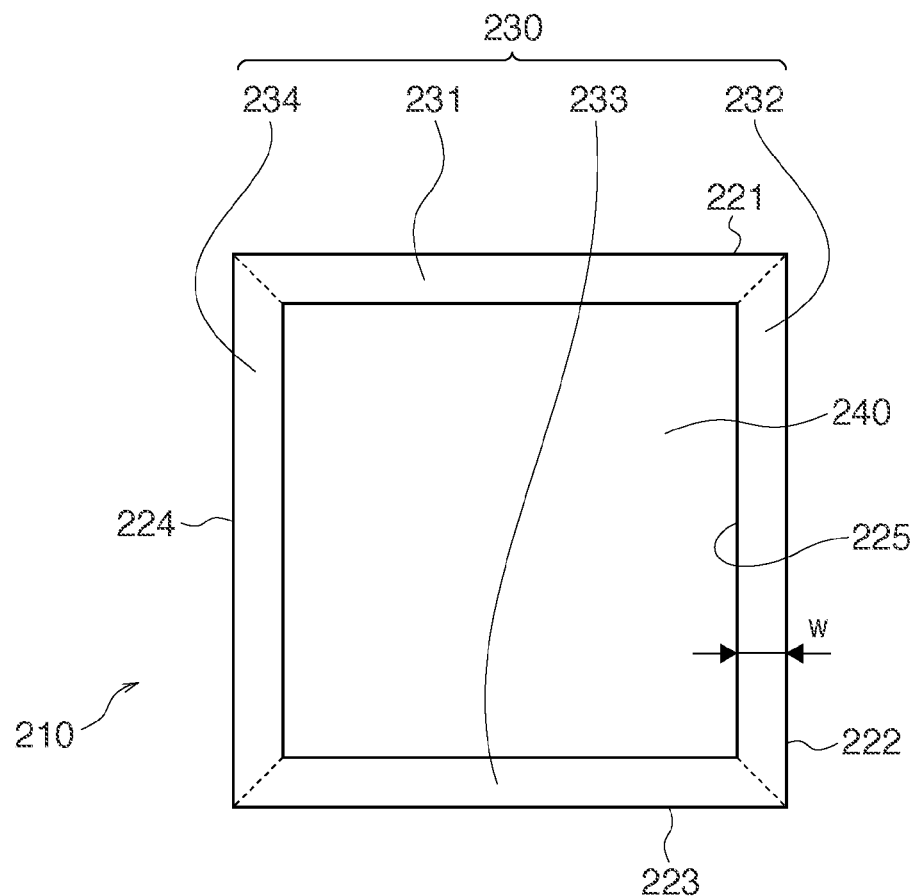
FIG. 14 is a view showing an example of the arrangement of a photomask.
Figure 15:
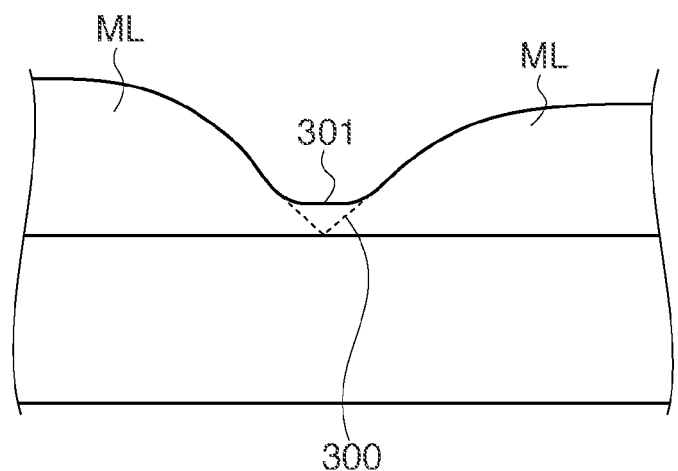

A photomask 200 used to manufacture the microlens array 60 by photolithography will be described below with reference to FIGS. 13 and 14. The photomask 200 has a microlens pattern configured by light-shielding and non-light-shielding portions used to form a microlens in each of a plurality of two-dimensionally arranged rectangular regions 210. Each rectangular region is typically a square region, but the present invention is not limited to this. Each light-shielding portion has a size that is not resolved by a wavelength (for example, 365 nm) of exposure light used in photolithography, and typically has a rectangular or circular shape. Each rectangular region 210 includes a surrounding region 230 having four sides 221 to 224 as outer edges, which specify boundaries of the rectangular region 210, and a primary region 240 having boundaries that are inner edges 225 of the surrounding region 230. The surrounding region 230 is configured by four strip regions 231 to 234 each of which includes one of the four sides 221 to 224 as a part of its contour. For example, the stripe region 231 includes the side 221 as a part of its contour. A width W between each of the sides 221 to 224 as the outer edges of the surrounding region 230 and each inner edge 225 is ½ or less of the wavelength of exposure light used in photolithography. Each of the strip regions 231 to 234 may have a shape of an elongated trapezoid, as exemplified in FIG. 14 or a rectangle, or may have other shapes.

Photomask data can be generated typically by a computer according to a generation method of the embodiment of the present invention. The method or step of generating photomask data includes first and second steps. In the first step, the computer determines a layout of light-shielding and non-light-shielding portions on the primary region 240 of each rectangular region 210. This step corresponds to generation of photomask data of the primary region 240. In this case, a layout of light-shielding and non-light-shielding portions on the surrounding region 230 may be provisionally determined in addition to the primary region 240 in the first step. However, the layout of light-shielding and non-light-shielding portions on the surrounding region 230 is finally determined in the second step. In the second step, the computer determines the layout of light-shielding and non-light-shielding portions on the surrounding region 230 so that a density of light-shielding portions is set to fall within a range from 0% to 15% (both inclusive), and the densities of light-shielding portions of the four strip regions 231 to 234 are equal to each other. This step corresponds to generation of photomask data of the surrounding region 230. In this case, the density of light-shielding portions is defined by (an area of light-shielding portions)/((an area of light-shielding portions)+(an area of non-light-shielding portions)). The photomask data includes a binary data sequence in which a light-shielding portion can be expressed by "1", and a non-light-shielding portion can be expressed by "0", or vice versa.

When the width W of the surrounding region 230 exceeds ½ of the wavelength of exposure light, gaps are formed on boundary portions of neighboring microlenses, and a focusing ability may lower. Thus, it is preferable that the width W of the surrounding region 230 is ½ or less of the wavelength of exposure light. When the density of light-shielding portions of the surrounding region 230 is set to fall within the range from 0% to 15% (both inclusive), a photoreaction of a photosensitive lens material on boundary portions between microlenses (or peripheral portions of microlenses) can be promoted. Then, the microlens shape on the boundary portion can be approximated to a target shape, thus improving the focusing ability. Furthermore, since the densities of light-shielding portions of the four strip regions 231 to 234, which configure the surrounding region 230, are set to be equal to each other, respective microlenses can have a uniform shape.

A method of fabricating a photomask according to the embodiment of the present invention can include a step of generating photomask data by the aforementioned generation method, and a step of fabricating a photomask according to the photomask data. The step of fabricating the photomask can include, for example, a step of drawing patterns including light-shielding and non-light-shielding portions on a substrate by an electron beam exposure apparatus according to the photomask data.

Some embodiments will be described below.

[First Embodiment]

Figure 16A:
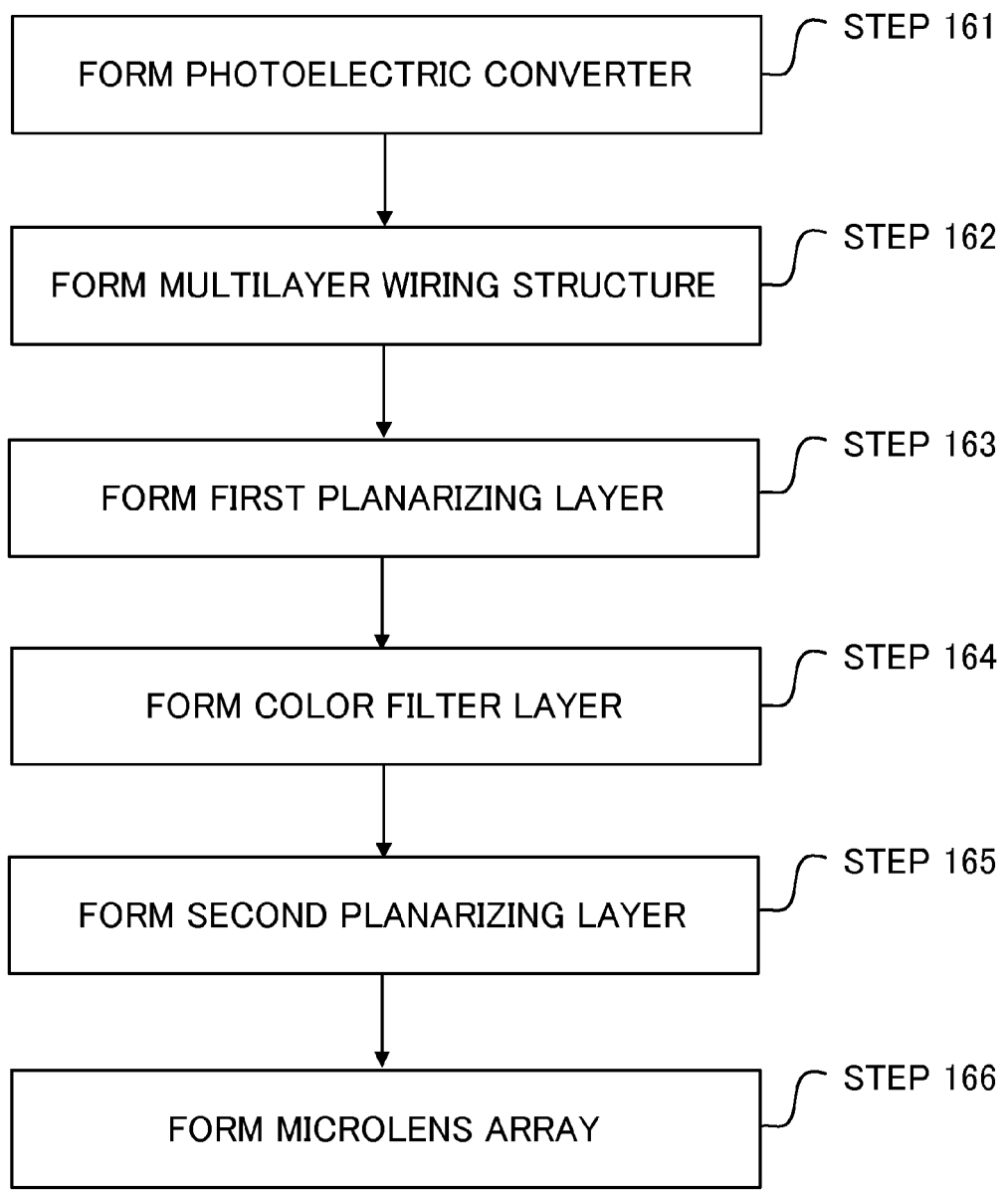
FIGS. 16A and 16B are flowcharts showing a method of manufacturing a solid-state image sensor.
Figure 16B:
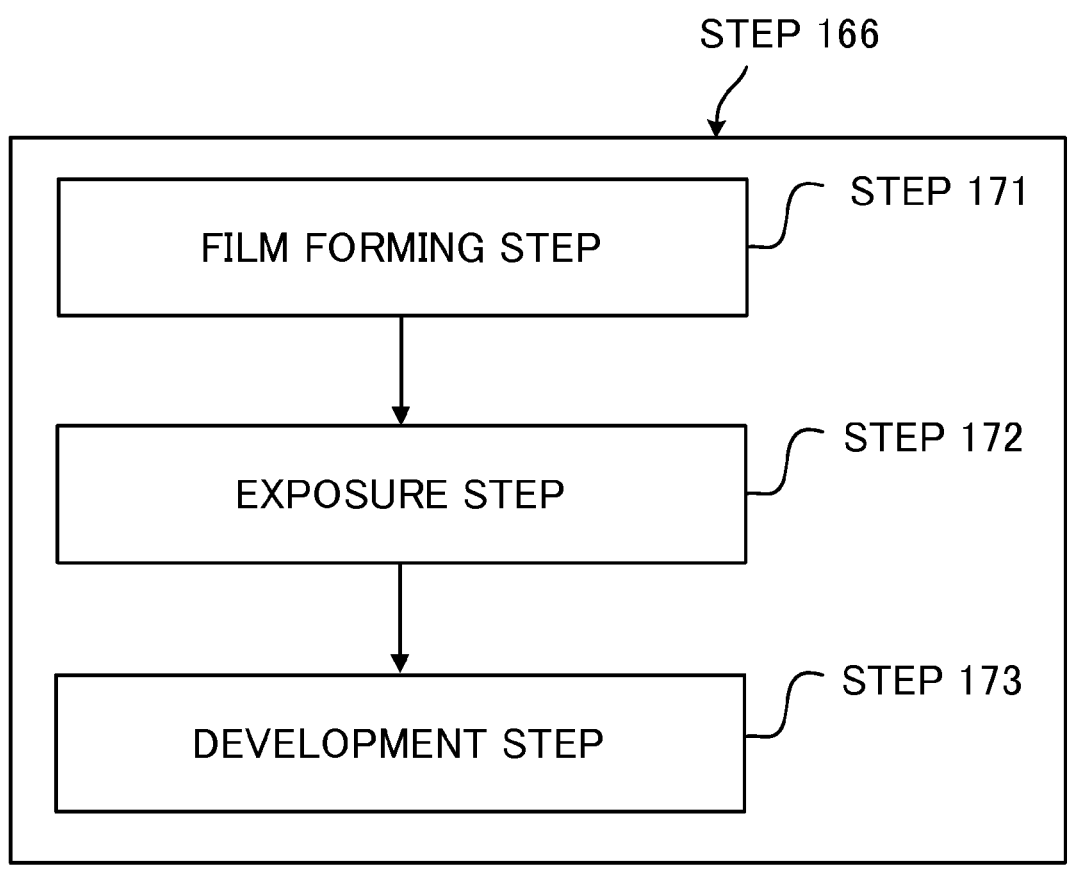

A method of manufacturing a solid-state image sensor according to the first embodiment will be described below with reference to FIGS. 16A and 16B. Initially, as shown in FIG. 16A, the photoelectric converter array 12 including the plurality of photoelectric converters 11 is formed on the semiconductor substrate 10 shown in FIG. 12 (STEP 161), and the multilayer wiring structure 20, first planarizing layer 30, color filter layer 40, and second planarizing layer 50 are formed in turn on the semiconductor substrate 10 (STEP 162, STEP 163, STEP 164, and STEP 165, respectively). Then, the microlens array 60 is formed on the second planarizing layer 50 by photolithography (STEP 166). As shown in FIG. 16B, the step of forming the microlens array 60 (STEP 166) includes a film forming step (STEP 171), exposure step (STEP 172), and development step (STEP 173).In the film forming step, for example, a photosensitive lens material film, which leaves a film of a thickness according to a transmittance (that is, an exposure amount) of the photomask 200 after development, is formed on the second planarizing layer 50. Each rectangular region 210 of the photomask 200 corresponds to one microlens 62. Each light-shielding portion formed on each rectangular region 210 of the photomask 200 has a size which is not resolved by the wavelength of exposure light, as described above. For example, the light-shielding portion can have a size of 0.06 μm, and exposure light can have a wavelength of 365 nm. In the development step, the photosensitive lens material film is developed, thereby forming the microlens 62 or microlens array 60.

Figure 5:
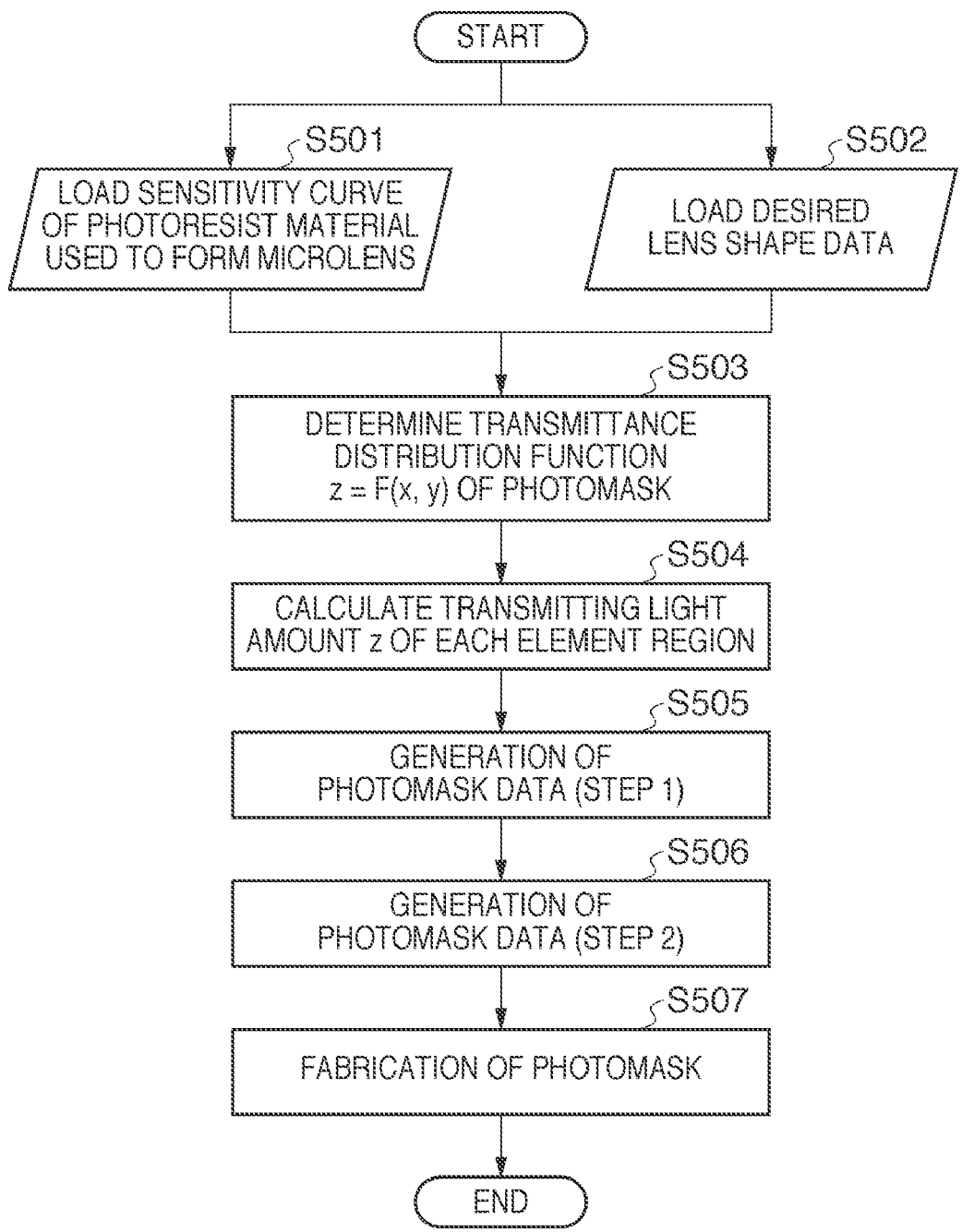
FIG. 5 is a flowchart showing a method of fabricating a photomask.

The method of fabricating the photomask will be described below with reference to FIGS. 5 to 11. In FIG. 5, steps S501 to S506 exemplify the method of generating photomask data, which can be executed by a computer according to a program. The program can be stored in a memory medium. Step S507 is a step of fabricating a photomask according to the photomask data by a photomask manufacturing apparatus such as an electron beam exposure apparatus.

Figure 6:
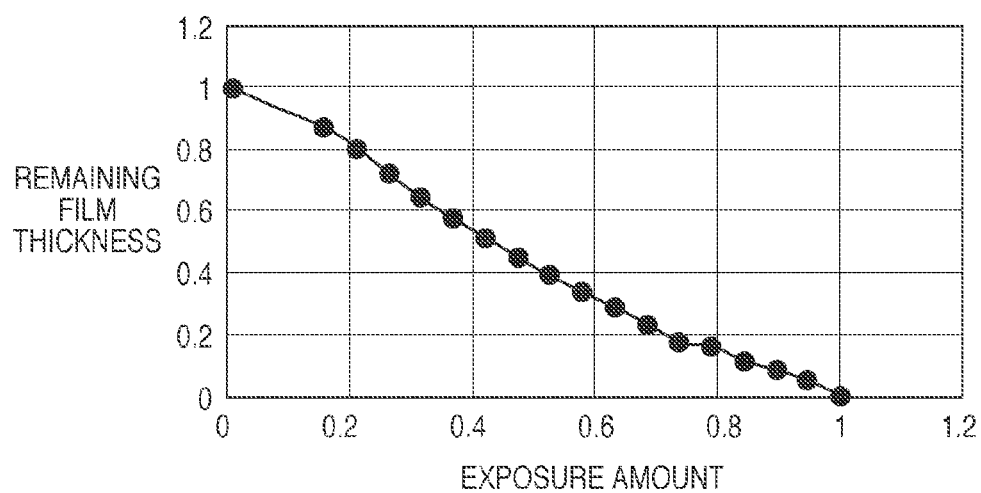
FIG. 6 is a graph showing an example of a sensitivity curve of a positive photoresist material.
Figure 7:
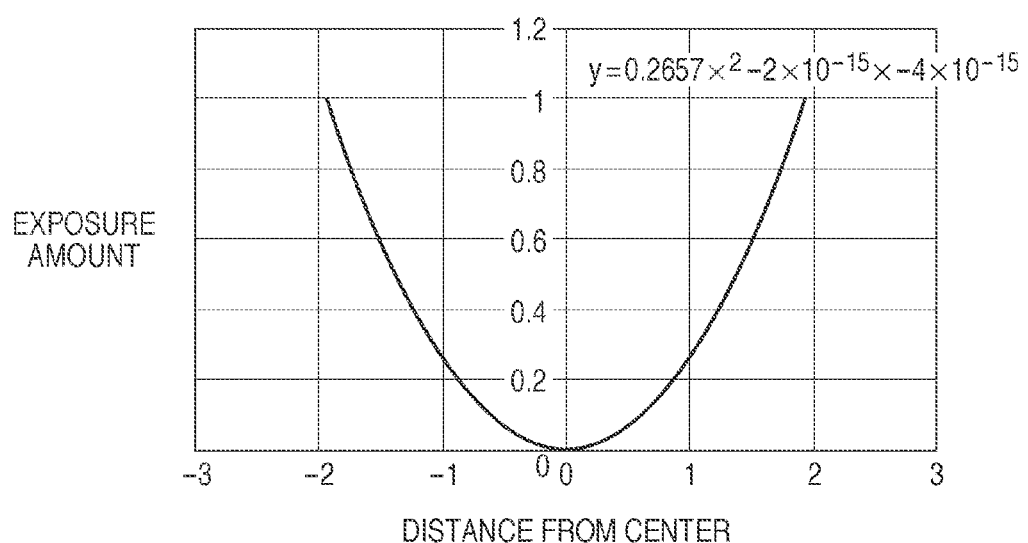
FIG. 7 is a graph showing an example of an exposure amount (amount of transmitting light) determined based on the sensitivity curve shown in FIG. 6.
Figure 8A:
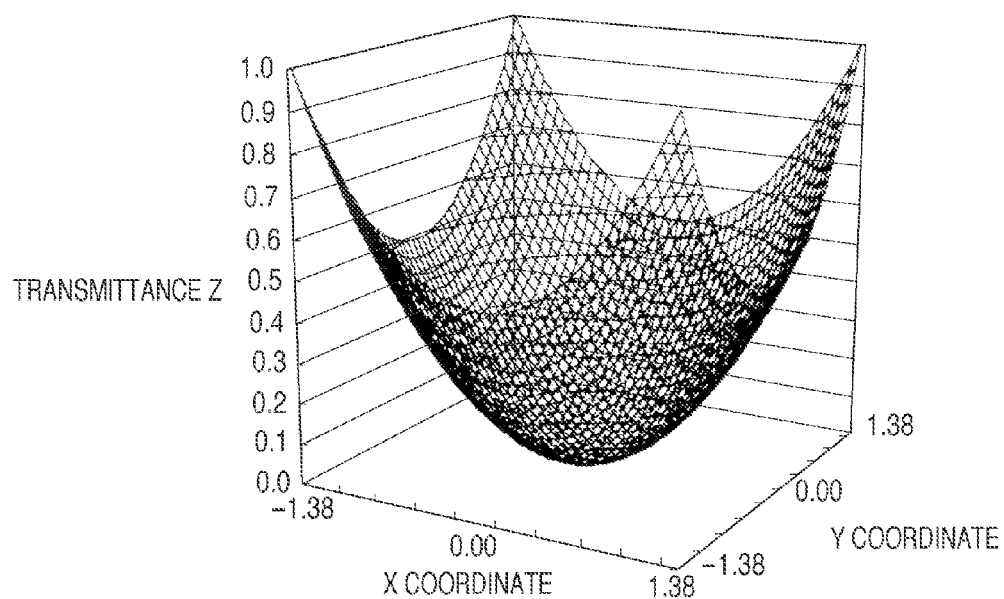
FIGS. 8A and 8B are views showing an example of a function that represents a transmittance distribution.
Figure 8B:
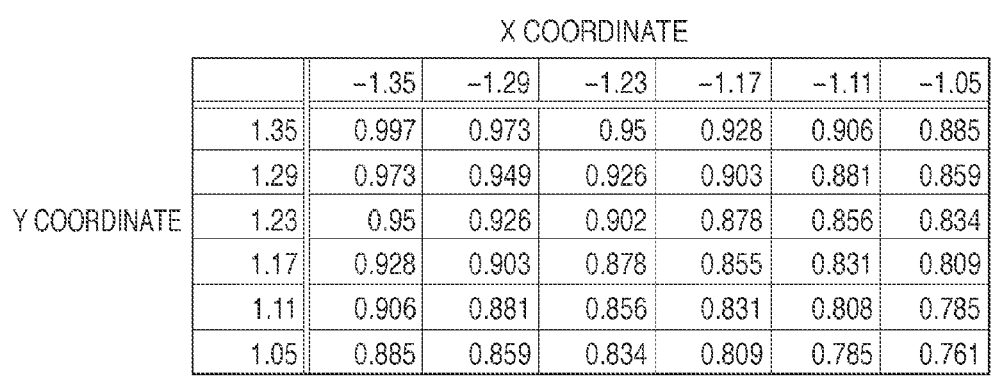

In step S501, the computer loads a sensitivity curve of a photoresist material used to form microlenses from a memory. FIG. 6 exemplifies the sensitivity curve of a positive photoresist material. In step S502, the computer loads lens shape data indicating a shape of each microlens 62 from the memory. This lens shape data can be, for example, data which expresses the surface shape of each microlens 62 to be formed on an XYZ coordinate system. In step S503, the computer determines a function indicating a transmittance distribution of each rectangular region 210 of the photomask 200 based on the sensitivity curve and lens shape data. That is, the computer determines an exposure amount required to obtain the thickness of each microlens indicated by the lens shape data based on the sensitivity curve, and then determines a transmittance required to obtain that exposure amount. FIG. 7 exemplifies the exposure amount determined based on the sensitivity curve shown in FIG. 6. FIGS. 8A and 8B exemplify the function indicating the transmittance distribution. In FIG. 8A, the function indicating the transmittance function is visually expressed, and FIG. 8B expresses it by numerical values. In this example, a transmittance $z=F(x, y)$ at a position $(x, y)$ specified by x and y coordinates is given.

In step S504, the computer determines a transmittance z for each of a plurality of element regions which configure each rectangular region 210 of the photomask 200. Note that the transmittance z for element regions which configure the surrounding region 230 need not be determined. In this case, each element region is a region obtained by dividing the primary region 240 in the rectangular region 210 at predetermined pitches in the x and y directions, respectively. In this example, the primary region 240 and surrounding region 230 are determined, so that the boundaries between the primary region 240 and surrounding region 230 match those of element regions, for the sake of simple processing.

In steps S505 and S506, the computer generates photomask data (dot data) based on the transmittances z of the plurality of element regions. Step S505 is the first step of generating the photomask data. In the first step, the computer determines whether to lay out a light-shielding portion or non-light-shielding portion on each element region which belongs to the primary region 240 of each rectangular region 210 of the photomask 200 by binarizing the transmittances z for the plurality of element regions to "1" and "0" by the error diffusion method. This processing is an application of an image processing technique that converts multi-valued pixel data into binary pseudo halftone pixel data. With this processing, a multi-valued transmittance z is converted into binary data indicating whether to lay out a light-shielding portion or non-light-shielding portion. In the following description, assume that a value "1" of binary data corresponding to a coordinate position $(x, y)$ of an element region indicates to form a light-shielding portion (dot) at the coordinate position $(x, y)$ of the photomask. Also, assume that a value "0" of binary data corresponding to a coordinate position $(x, y)$ of an element region indicates to lay out a non-light-shielding portion at the coordinate position $(x, y)$ of the photomask 200. A binarization example based on the error diffusion method in step S505 will be described later.

Step S506 is the second step of generating photomask data. In the second step, the computer determines whether to lay out light-shielding portion or non-light-shielding portion on each element region which belongs to the surrounding region 230. In this case, in the second step, the layout of light-shielding and non-light-shielding portions on the surrounding region 230 is determined, so that the density of light-shielding portions is set to fall within a range from 0% to 15% (both inclusive), and the densities of light-shielding portions of the four strip regions 231 to 234 are equal to each other. The photomask data is completed by arranging a plurality of rectangular regions 210 that have been formed in accordance with the above method.

Figure 1:
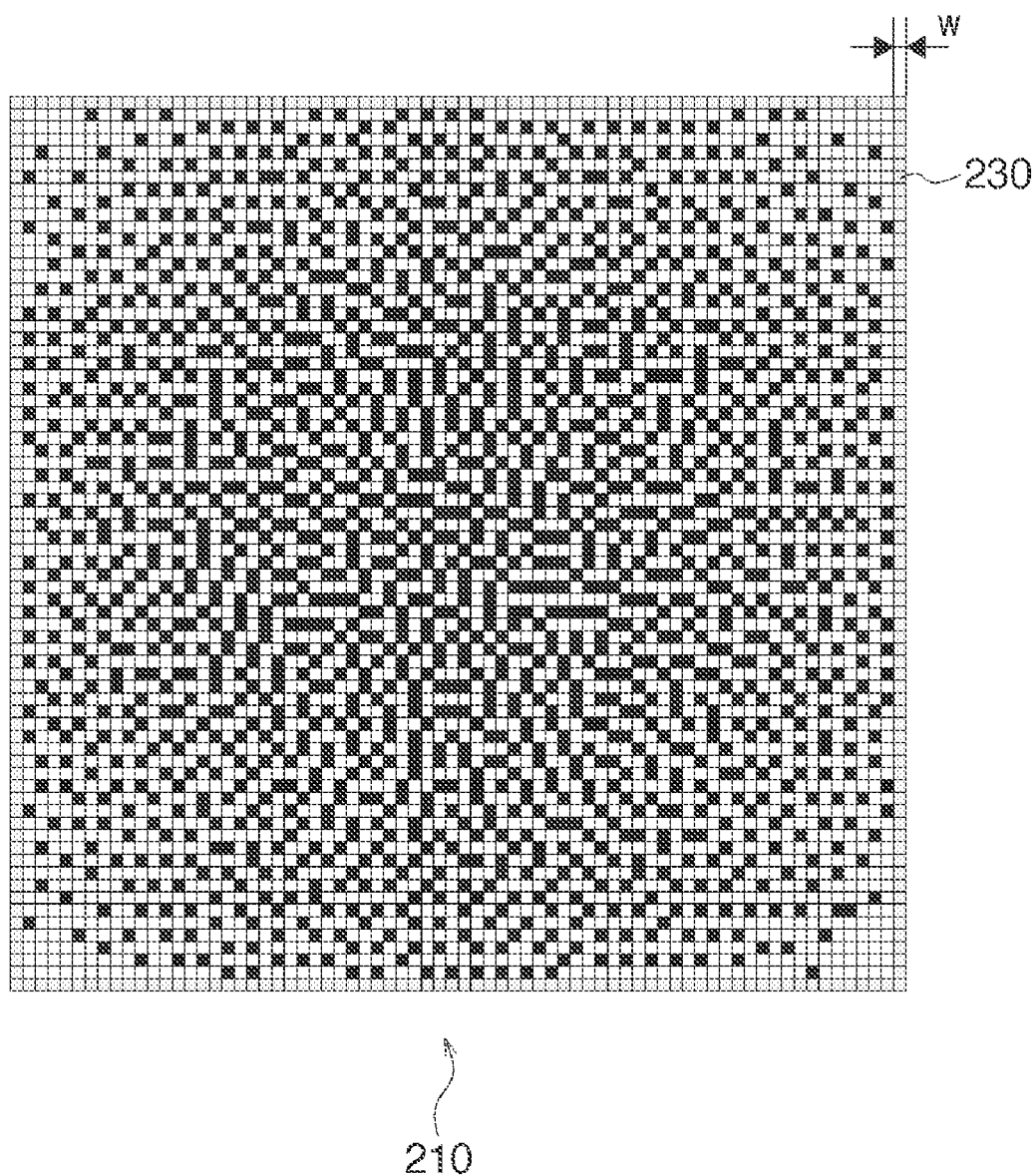
FIG. 1 shows a microlens pattern generated according to the first embodiment.

FIG. 1 shows a microlens pattern for one rectangular region of the photomask generated according to the first embodiment. Black element regions indicate light-shielding portions, and white element regions indicate non-light-shielding portions. FIG. 1 can also be understood as a view which visualizes data of a microlens pattern of one rectangular region, that is, photomask data of one rectangular region. In the embodiment shown in FIG. 1, the wavelength of exposure light is 365 nm, the width W of the surrounding region 230 is 0.06 μm, and the length of each side of the surrounding region 230 is 4.3 μm. However, the present invention is not limited to such specific example.

In step S507, a photomask is fabricated by a photomask manufacturing apparatus such as an electron beam exposure apparatus according to the photomask data generated in the mask data generation step including step S505 (first step) and step S506 (second step).

FIGS. 9A to 9E show a practical example of the binarization based on the error diffusion method used in the process in step S505. Note that the binarization based on the error diffusion method is a known image processing method, and various methods can be applied to the present invention in addition to the example taken in this case. FIGS. 9A to 9E show a rectangular region (corresponding to one microlens) including 5×5 element regions, for the sake of simplicity. In FIGS. 9A to 9E, the horizontal direction indicates an X direction, the vertical direction indicates a Y direction, and a numerical value in each element region indicates a transmittance. In this embodiment, the binarization progresses counterclockwise from the central element region of each rectangular region toward outer element regions, as shown in FIG. 11A. Alternatively, the binarization may progress clockwise from the central element region of each rectangular region toward outer element regions, as shown in FIG. 11B. Alternatively, the binarization may progress counterclockwise or clockwise from an outer element region of each rectangular region toward the central element region, as shown in FIG. 11C or 11D.

In this embodiment, an error is diffused according to a matrix shown in FIG. 10. A "cell whose error diffusion processing is in progress" is an element region of interest. To cells (element regions) which are located at positions in upper, left, right, and left directions with respect to the cell whose error diffusion processing is in progress, values each multiplied by a weight=⅙(=1/(1+1+1+1+0.5+0.5+0.5+0.5)) to an error generated by the binarization of the cell whose error diffusion processing is in progress are added. To cells (element regions) which are located at positions in oblique directions with respect to the cell whose error diffusion processing is in progress, values each multiplied by a weight=1/12(=0.5/(1+1+1+1+0.5+0.5+0.5+0.5)) to an error generated by the binarization of the cell whose error diffusion processing is in progress are added. In the example shown in FIGS. 9A to 9E, the binarization starts from the central element region. A value "0.1" (FIG. 9A) as a transmittance of the central element region is compared with a value "0.5" as a binarization threshold. Since 0.1<0.5, the transmittance of the central element region after the binarization is set to be "0". An error (0.1) generated as a result of this binarization is diffused to eight surrounding element regions according to the matrix shown in FIG. 10 (FIG. 9B). Next, the right neighboring element region of the central element region is binarized (FIGS. 9C and 9D). Next, the element region above the central element region is binarized (FIG. 9E).

Note that in this embodiment, data for respective element regions which belong to the primary region 240 are obtained in the first step of step S505. However, in this step, data up to the surrounding region 230 may be obtained in addition to the primary region 240. In other words, the element regions can be arranged in the surrounding region 230 as well as in the primary region 240. It is designed to form a microlens on the entire surface of the rectangular region 210 so as not to form any gaps from neighboring microlenses. In such case, by processing the data up to the surrounding region 230, calculation processing upon forming the transmittance distribution of microlenses can be facilitated.

[Second Embodiment]

Figure 2:
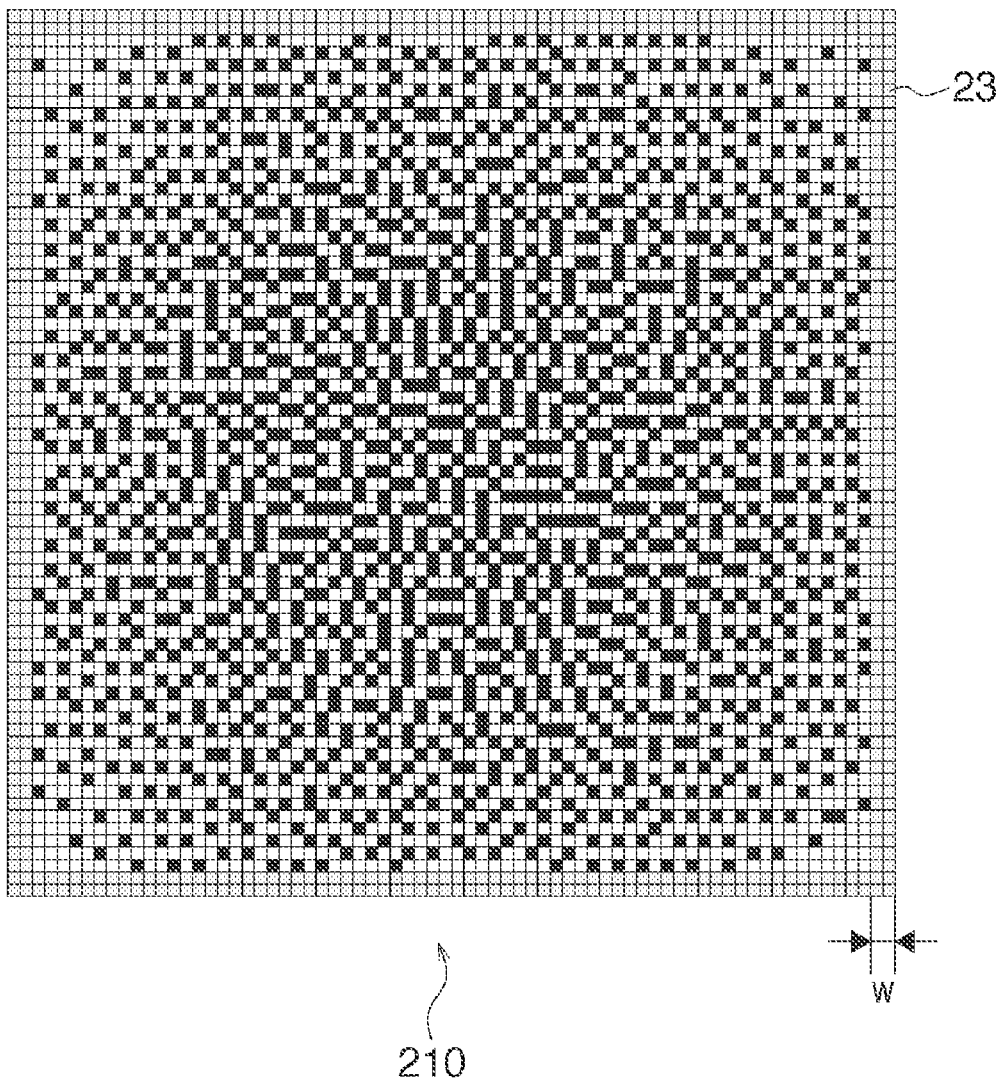
FIG. 2 shows a microlens pattern for one rectangular region of a photomask generated according to the second embodiment.

FIG. 2 shows a microlens pattern for one rectangular region of a photomask generated according to the second embodiment. The second embodiment is different from the first embodiment shown in FIG. 1 in that the width W of the surrounding region is 0.12 μm, but other conditions are the same as those in the first embodiment. In the second embodiment, since the width W of the surrounding region is set to be larger than that of the surrounding region 230 of the first embodiment, the shape of a microlens on the boundary portion can be more approximated to the target shape.

[Third Embodiment]

Figure 3:
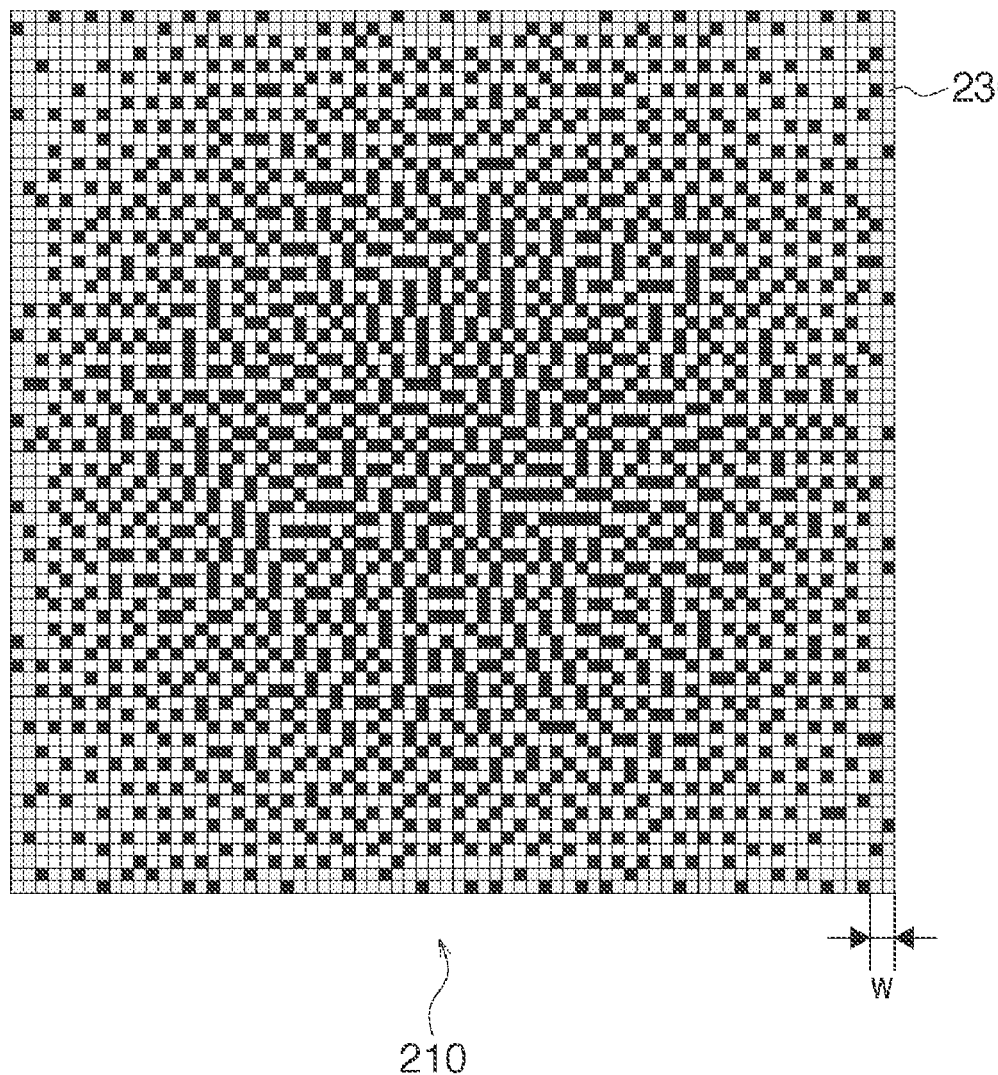
FIG. 3 shows a microlens pattern for one rectangular region of a photomask generated according to the third embodiment.

FIG. 3 shows a microlens pattern for one rectangular region of a photomask generated according to the third embodiment. The third embodiment is different from the second embodiment in that the density of light-shielding portions of the surrounding region 230 determined in the second step is set to be 15%, but other conditions are the same as those in the second embodiment. In the third embodiment, since a large density of light-shielding portions of the surrounding region 230 is set, the shape of a microlens on the boundary portion becomes smoother than the second embodiment, but an error from the target shape falls within an allowable range.

[Fourth Embodiment]

Figure 4:
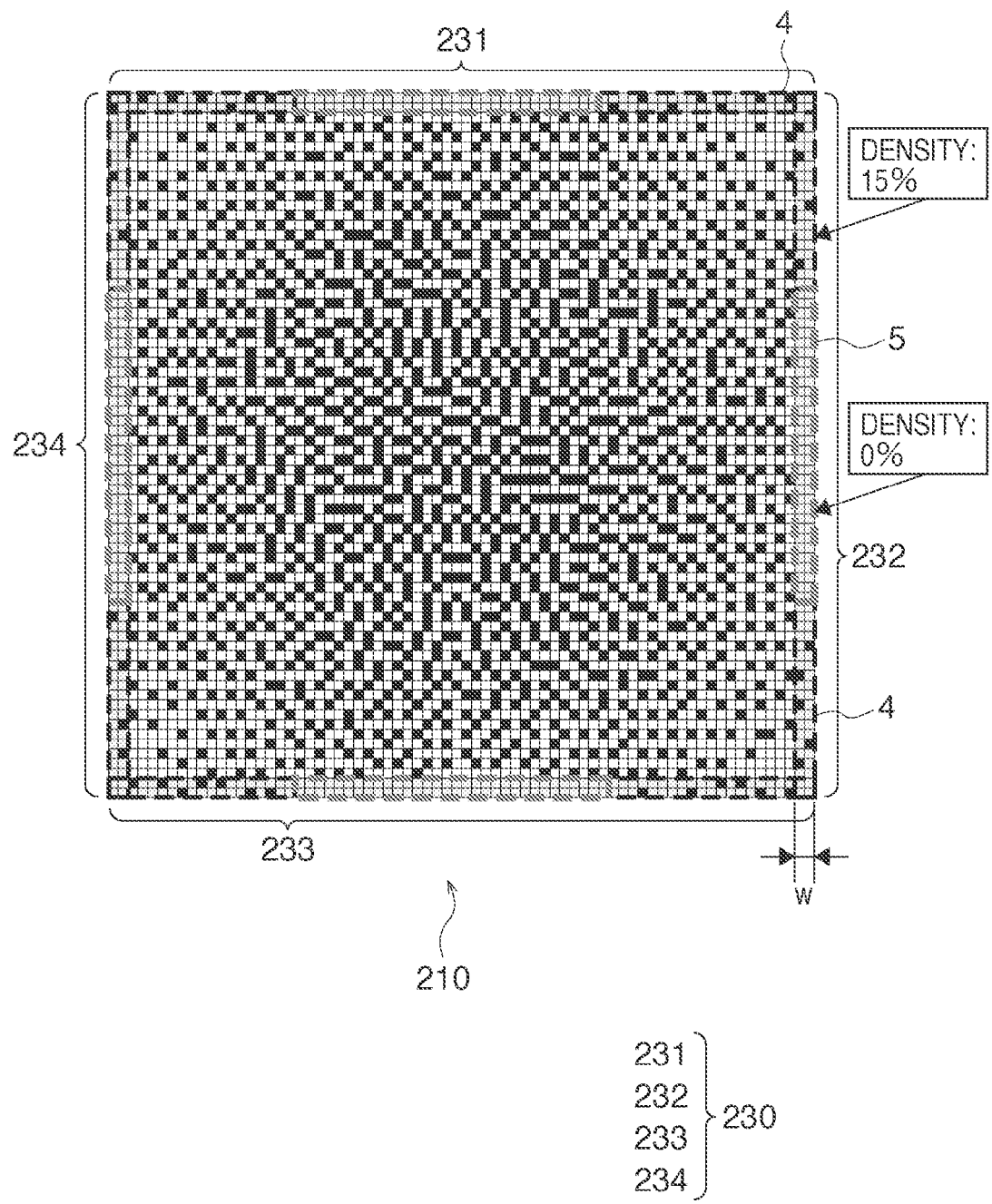
FIG. 4 shows a microlens pattern for one rectangular region of a photomask generated according to the fourth embodiment.

FIG. 4 shows a microlens pattern for one rectangular region of a photomask generated according to the fourth embodiment. The fourth embodiment is different from the second and third embodiments in that each of the four strip regions 231 to 234 which configure the surrounding region 230 is configured by two types of regions having different densities of light-shielding portions. In the fourth embodiment, each strip region includes two end-side regions 4 and a central region 5 sandwiched between the two end-side regions 4. The width W of the surrounding region 230 is 0.12 μm, and the length of each side of the surrounding region 230 is 4.3 μm, but these values are merely examples. In the second step, it is preferable that the density of light-shielding portions of each end-side region 4 is set to be higher than that of the central region 5. This is because the central region has a higher tendency that the boundary portion of a microlens is smoothed than that of the end-side regions. In the example shown in FIG. 4, the density of light-shielding portions of each end-side region 4 is set to be 15%, and that of the central region 5 is set to be 0%. Note that the fourth embodiment also satisfies the condition that the density of light-shielding portions is set to fall within a range from 0% to 15% (both inclusive), and the densities of light-shielding portions of the four strip regions 231 to 234 are equal to each other.

[Fifth Embodiment]

A method of manufacturing a solid-state image sensor 100 will be described below with reference to FIG. 12. A photoelectric conversion array 12 and circuit of the solid-state image sensor 100 in FIG. 12 are formed on a semiconductor substrate 10. After that, a multilayer wiring structure 20 is formed on the semiconductor substrate 10, and a first planarizing layer 30, color filter layer 40, and second planarizing layer 50 are formed. In this case, the second planarizing layer 50 has a function as an antireflection film. A microlens material is applied on the second planarizing layer 50, and is exposed using a photomask prepared in the aforementioned embodiment. Then, the exposed microlens material is developed to form a microlens array.

The color filter layer 40 of this embodiment has color filters of a plurality of colors, and is, for example, a color filter layer of a Bayer matrix. Since the color filters have different film thicknesses for respective colors, the upper surface of the color filter layer 40 has low flatness. When the microlens array 60 is directly formed on such color filter layer 40, defocuses of exposure light are generated for respective colors of the color filters upon exposing the microlens material, resulting in variations of the shape of the microlens array. Hence, by arranging the second planarizing layer 50 of this embodiment, the upper surface of the color filter layer 40 is planarized, thus improving uniformity of the microlens array.

The color filter layer 40 has different surface reflectances for respective colors. When the microlens array 60 is directly formed on such color filter layer 40, exposure light is reflected by the upper surface of the color filter layer 40, and exposure energies upon exposing the microlens material change for respective colors. As a result, the shape of the microlens array may be varied. Hence, since the second planarizing layer has a function as an antireflection film, it can eliminate reflections of exposure light, thus improving the uniformity of the microlens array.

In the above embodiments, the densities of light-shielding portions of the four strip regions 231 to 234 in the surrounding region 230 are equal to each other. However, the present invention is not limited to such embodiments. For example, in a rectangular region 210 whose four sides 221 to 224 all contact with the other rectangular regions 210, the densities of light-shielding portions of the four strip regions 231 to 234 are preferably equal to each other. For example, in a rectangular region 210 whose two sides contact with the other rectangular regions 210 and whose other two sides do not contact with the other rectangular regions 210, the densities of light-shielding portions of the two strip regions having the two sides that contact with the other rectangular regions 210 may be a first density and the densities of light-shielding portions of the two strip regions having the other two sides that do not contact with the other rectangular regions 210 may be a second density that is different from the first density.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-002375 filed Jan. 7, 2010 and 2010-282401 filed Dec. 17, 2010, which are hereby incorporated by reference herein in their entirety.

What is claimed is:

1. A method of generating photomask data used to fabricate a photomask, which is to be used for manufacturing a microlens array by photolithography, the photomask having a microlens pattern including light-shielding portions and non-light-shielding portions for forming a microlens, in each of a plurality of two-dimensionally arranged rectangular regions, each rectangular region including a surrounding region having four sides of the rectangular region as outer edges and a primary region having boundaries that are inner edges of the surrounding region, the surrounding region being configured by four strip regions each of the four strip regions including one of the four sides as a part of a contour of each strip region, and a width between each outer edge and each corresponding inner edge of the surrounding region being not more than ½ of a wavelength of exposure light to be used in the photolithography, the method comprising:

a first step of determining a layout of light-shielding portions and non-light-shielding portions in the primary region; and a second step of determining a layout of light-shielding portions and non-light-shielding portions in the surrounding region so that a first density of the light-shielding portions defined by (an area of light-shielding portions)/((an area of light-shielding portions)+(an area of non-light-shielding portions)) is set to fall within a range from 0% to 15% (both inclusive).

2. The method according to claim 1, where in the second step, the layout of light-shielding portions and non-light-shielding portions in the surrounding region is determined so that a second density of the light-shielding portions in each of the four strip regions is equal to that in each of the other strip regions.

3. The method according to claim 1, where in the first step, the layout of the light-shielding portions and the non-light-shielding portions is determined by binarizing a transmission distribution to be formed on the photomask by an error diffusion method.

4. The method according to claim 1, wherein each of the four strip regions includes two end-side regions and a central region sandwiched in between the two end-side regions, and in the second step, a third density of the light-shielding portions in each end-side region is set to be higher than a fourth density of the light-shielding portions in the central region.

5. A method of fabricating, by photolithography, a photomask, which is to be used for manufacturing a microlens array, the method comprising:

a first step of generating photomask data by the generation method according to claim 1; and a second step of fabricating a photomask according to the generated photomask data.

6. A non-transitory memory medium storing a program for controlling a computer to execute processing for generating photomask data to be used for fabrication of a photomask by photolithography, where the photomask is to be used for manufacturing a microlens array, the photomask having a microlens pattern including light-shielding portions and non-light-shielding portions for forming a microlens, in each of a plurality of two-dimensionally arranged rectangular regions, each rectangular region including a surrounding region having four sides of the rectangular region as outer edges and a primary region having boundaries that are inner edges of the surrounding region, the surrounding region being configured by four strip regions each of the four strip regions including one of the four sides as a part of a contour of each strip region, and a width between the each edge and each corresponding inner edge of the surrounding region being not more than ½ of a wavelength of exposure light to be used in the photolithography, the program controlling the computer to execute processing including:

a first step of determining a layout of light-shielding portions and non-light-shielding portions in the primary region; and a second step of determining a layout of light-shielding portions and non-light-shielding portions in the surrounding region so that a first density of the light-shielding portions defined by (an area of light-shielding portions)/((an area of light-shielding portions)+(an area of non-light-shielding portions)) is set to fall within a range from 0% to 15% (both inclusive).

7. The non-transitory memory medium according to claim 6, where in the second step, a second step of determining the layout of light-shielding portions and non-light-shielding portions in the surrounding region so that a second density of the light-shielding portions in each of the four strip regions is equal to that in each of the other strip regions.

8. A method of manufacturing a solid-state image sensor, comprising:

a first step of forming a photoelectric converter array including a plurality of two-dimensionally arranged photoelectric converters; and a second step of forming a microlens array on the photoelectric converter array by photolithography using the photomask fabricated by the fabrication method according to claim 5.

9. The method according to claim 8, further comprising, before the second step of forming the microlens array, a third step of forming a color filter layer having a plurality of colors on upper portions of the plurality of two-dimensionally arranged photoelectric converters; and a fourth step of forming a planarizing layer having an antireflection function on the color filter layer.

10. A method of manufacturing a microlens array, comprising:

a third step of forming a photosensitive material layer on a substrate; and a fourth step of forming the microlens array by exposing the photosensitive material layer by using the photomask fabricated according to claim 5, and developing the exposed photosensitive material layer.

* * * * *